United States Patent
Ihm et al.

(10) Patent No.: US 10,176,878 B2
(45) Date of Patent: Jan. 8, 2019

(54) SENSE AMPLIFIER AND MEMORY DEVICE USING THE SAME

(71) Applicants: Jeong-don Ihm, Seongnam-si (KR); Siddharth Katare, Hwaseong-si (KR); Hyun-jin Kim, Hwaseong-si (KR)

(72) Inventors: Jeong-don Ihm, Seongnam-si (KR); Siddharth Katare, Hwaseong-si (KR); Hyun-jin Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/452,885

(22) Filed: Mar. 8, 2017

(65) Prior Publication Data
US 2017/0316833 A1    Nov. 2, 2017

(30) Foreign Application Priority Data

May 2, 2016 (KR) ........................ 10-2016-0054100

(51) Int. Cl.
| | |
|---|---|
| *G11C 16/28* | (2006.01) |
| *G11C 16/04* | (2006.01) |
| *G11C 7/06* | (2006.01) |
| *G11C 7/12* | (2006.01) |
| *G11C 16/24* | (2006.01) |
| *H01L 27/11582* | (2017.01) |

(52) U.S. Cl.
CPC .............. *G11C 16/28* (2013.01); *G11C 7/062* (2013.01); *G11C 7/067* (2013.01); *G11C 7/12* (2013.01); *G11C 16/0483* (2013.01); *G11C 16/24* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 4,982,364 | A | 1/1991 | Iwahashi |
| 5,148,063 | A | 9/1992 | Hotta |
| 5,191,552 | A | 3/1993 | Nakai et al. |
| 5,197,028 | A | 3/1993 | Nakai |
| 5,381,374 | A | 1/1995 | Shiraishi et al. |
| 6,018,487 | A | 1/2000 | Lee et al. |

(Continued)

FOREIGN PATENT DOCUMENTS

| | | |
|---|---|---|
| JP | H06096591 A | 4/1994 |
| KR | 100234390 B1 | 12/1999 |
| KR | 10-0481826 B1 | 3/2005 |

*Primary Examiner* — Douglas King
(74) *Attorney, Agent, or Firm* — Harness, Dickey & Pierce, P.L.C.

(57) ABSTRACT

A single-ended sense amplifier and a memory device including the same are presented. A sense amplifier, which senses and amplifies data of a memory cell, may include a pre-charge circuit pre-charging a data line which is connected to the memory cell and provides a sensing voltage, and a reference line which provides a reference voltage, with a power supply voltage; a reference voltage generating circuit which generates the reference voltage by discharging the reference line based on a reference current, and adjusts an amount of the reference current based on the data of the memory cell; and a comparator which compares the sensing voltage and the reference voltage, and outputs a comparison result as the data of the memory cell.

20 Claims, 12 Drawing Sheets

(56) References Cited

U.S. PATENT DOCUMENTS

| | | | |
|---|---|---|---|
| 6,381,187 B1 | 4/2002 | Lee et al. | |
| 6,804,141 B1 * | 10/2004 | Rickes | G11C 11/22 |
| | | | 365/145 |
| 7,352,618 B2 * | 4/2008 | Kim | G11C 11/5642 |
| | | | 365/185.02 |
| 9,001,588 B2 * | 4/2015 | Kim | G11C 11/56 |
| | | | 365/185.2 |
| 2009/0116290 A1 * | 5/2009 | Yamada | G11C 16/28 |
| | | | 365/185.17 |
| 2015/0078103 A1 | 3/2015 | Roy | |

* cited by examiner (Conventional timing diagram)

SENSE AMPLIFIER AND MEMORY DEVICE USING THE SAME

CROSS-REFERENCE TO RELATED APPLICATION

This application claims the benefit of Korean Patent Application No. 10-2016-0054100, filed on May 2, 2016, in the Korean Intellectual Property Office, the disclosure of which is incorporated herein in its entirety by reference.

BACKGROUND

The inventive concept relates to a memory device, and more particularly, to a single-ended sense amplifier and a memory device using the same.

Semiconductor memory devices are classified into volatile semiconductor memory devices and non-volatile semiconductor memory devices. Volatile semiconductor memory devices include dynamic random access memory (DRAM) and static random access memory (SRAM). Non-volatile semiconductor devices include resistive memory devices such as flash memory devices, resistive random access memories (ReRAMs), phase-change random access memories (PRAMs), and magneto-resistive random access memories (MRAMs). A sense amplifier senses and amplifies digital data at a low level which is stored in a memory cell of a memory device, that is, weak digital data, and transforms the weak digital data into digital data at a high level. A single-ended sense amplifier compares a voltage of a bit line input to one of two input terminals, that is, a sensing voltage, with a reference voltage received via the other terminal, and outputs a comparison result as data of a memory cell.

The sense amplifier and the memory device using the same may perform a low-voltage drive operation during a read operation.

SUMMARY

The inventive concept provides a sense amplifier and a memory device.

According to aspects of the inventive concepts, a sense amplifier which senses and amplifies data of a memory cell may include a precharge circuit pre-charging a data line which is connected to the memory cell and provides a sensing voltage, and a reference line which provides a reference voltage, with a power supply voltage; a reference voltage generating circuit which generates the reference voltage by discharging the reference line based on a reference current, and adjusts an amount of the reference current based on the data of the memory cell; and a comparator which compares the sensing voltage and the reference voltage, and outputs a comparison result as the data of the memory cell.

According to other aspects of the inventive concepts, a memory device may include: a memory cell array which is selectively connected to data line and comprises a plurality of memory cells discharging a cell current from the data line according to stored data during a read operation; a load transistor which is connected to a pseudo data line and discharges an equal amount of current as that of the cell current from the pseudo data line; and a sense amplifier which generates a reference voltage based on a pseudo sensing voltage output from the pseudo data line, compares a sensing voltage output from the data line with the reference voltage, and outputs a comparison result as the stored data.

BRIEF DESCRIPTION OF THE DRAWINGS

Embodiments of the inventive concept will be more clearly understood from the following detailed description taken in conjunction with the accompanying drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

When the terms "about," "practically" or "substantially" are used in this specification in connection with a numerical value, it is intended that the associated numerical value include a tolerance of ±10% around the stated numerical value. When two values are termed "practically equal" it is intended that the two associated numerical values are within ±10% of each other. When two terms are termed "substantially equal" it is intended that the two associated numerical values are within ±10% of each other.

Figure 1:
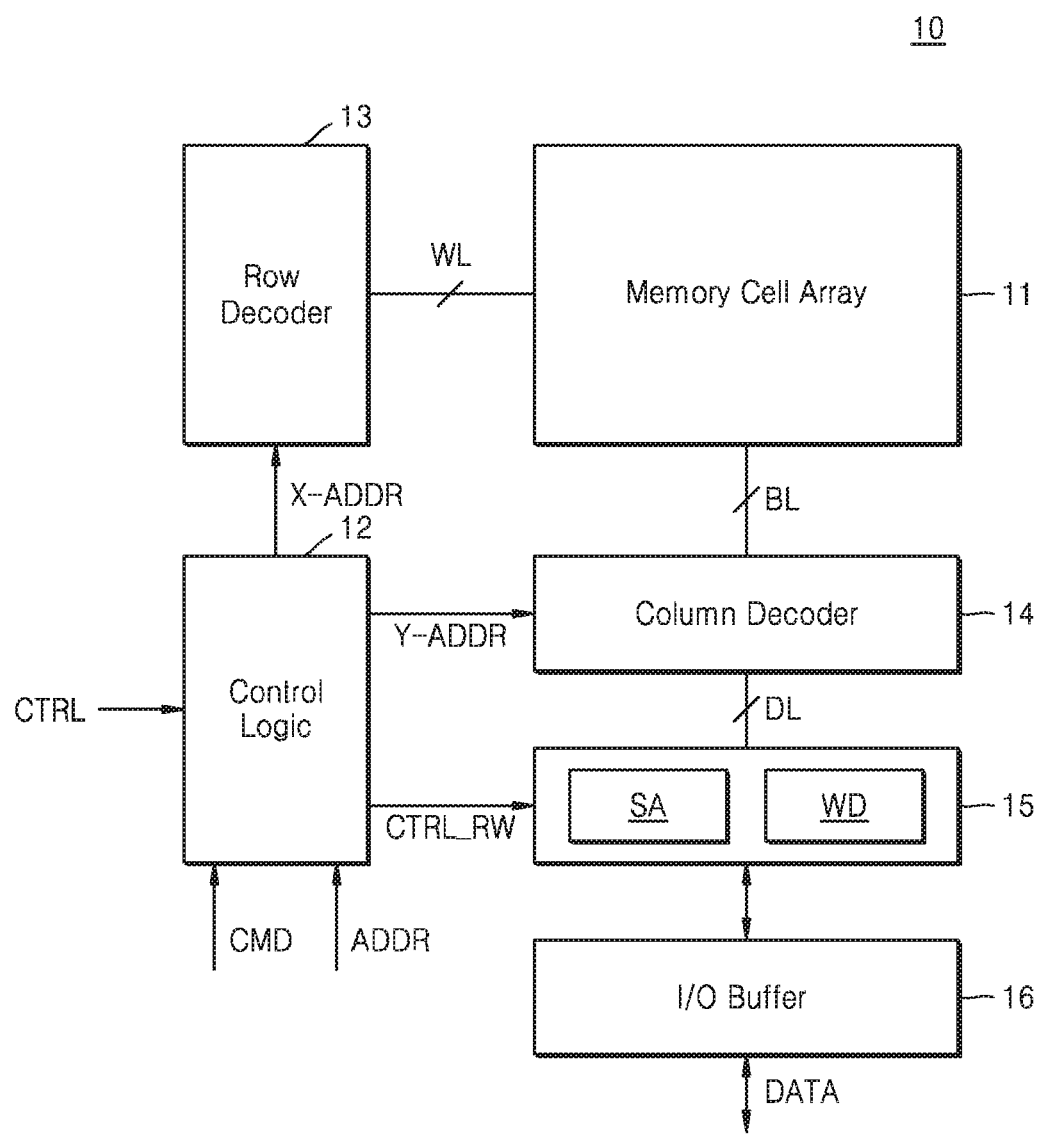
FIG. 1 is a block diagram of a memory device according to an example embodiment.

FIG. 1 is a block diagram of a memory device 10 according to an example embodiment.

Referring to FIG. 1, the memory device 10 may include a memory cell array 11, a control logic 12, a row decoder 13, a column decoder 14, a write/read circuit 15, and an input/output buffer 16. According to an example embodiment, the memory device 10 may be a volatile memory such as dynamic random access memory (DRAM) and a static random access memory (SRAM). Alternatively, the memory device 10 may be a non-volatile memory such as a flash memory device, magneto-resistive random access memory (MRAM), resistive random access memory (ReRAM), phase-change random access memory (PRAM), and ferro-electric random access memory (FRAM). According to an example embodiment, the memory device 10 may utilize various memory devices including single-ended sense amplifier circuits. Hereinafter, the memory device 10 is assumed to be a non-volatile memory for explanation of operation examples of the memory device 10, but the present inventive concepts are not limited to non-volatile memory.

The memory cell array 11 may include a plurality of memory cells and be connected to the row decoder 13 via word lines WLs. In addition, the memory cell array 11 may be connected to the column decoder 14 via bit lines BLs. The memory cell array 11 may include a plurality of cell blocks comprising the plurality of memory cells.

According to aspects of example embodiments, the memory cell array 11 may be a three-dimensional (3D) memory cell array. The 3D memory cell array may be monolithically formed in one or more physical levels of arrays of memory cells having an active area arranged above a silicon substrate and circuitry associated with the operation of these memory cells, whether such associated circuitry may be above or within such substrate. The term "monolithic" may denote that layers of each level of the memory cell array are directly deposited on the layers of each lower level of the memory cell array. The 3D memory cell array may include cell strings which are arranged in a vertical direction so that at least one memory cell is on other memory cells. At least one of the memory cells may include a charge trap layer. However, the embodiment is not limited thereto, and the memory cell array 11 may be a two-dimensional (2D) memory cell array in another embodiment.

Each memory cell included in the memory cell array 11 may be a single level cell (SLC) storing one-bit data or a multi-level cell (MLC) storing two-bit or more data. For example, the memory cell may be an MLC storing two-bit data. As another example, the memory cell may be a triple level cell (TLC) storing three-bit data. However, the embodiment is not limited thereto, and in another embodiment, a portion of memory cells included in the memory cell array 11 may be SLCs and other portion of memory cells may be MLCs. For example, a portion of cell blocks included in the memory cell array 11 may be SLCs, while other portion of cell blocks may be MLCs.

The control logic 12 may output various control signals to write data to the memory cell array 11 or to read data from the memory cell array 11, based on a command CMD, an address ADDR, and a control signal CTRL which are received from outside the memory device 10 (for example, a memory controller). Hereby, the control logic 12 may generally control various operations of the memory device 10.

Various control signals outputted by the control logic 12 may be provided to the row decoder 13, the column decoder 14, and the write/read circuit 15. In detail, the control logic 12 may provide a row address X-ADDR, and the column decoder 14 with a column address Y-ADDR to the row decoder 13. In addition, the control logic 12 may provide a write/read control signal CTRL_RW to the write/read circuit 15. However, the embodiment is not limited thereto, and the control logic 12 may further provide other control signals to the input/output buffer 16 and other components (not shown).

The row decoder 13 may select a portion of word lines WLs in response to the row address X-ADDR. The row decoder 13 may transfer a word line voltage to a memory cell array 11. In a program operation, the row decoder 13 may apply a program voltage and a verification voltage to a selected word line WL, and apply a program inhibit voltage to an un-selected word line UWL. For example, during a read operation, the row decoder 13 may apply a read voltage to the selected word line WL, and a read inhibit voltage to the un-selected word line UWL. In addition, the row decoder 13 may select a portion of string selection lines SSLs or a portion of ground selection lines GSLs, which are included in the memory cell array 11, in response to the row address X-ADDR.

The column decoder 14 may select a portion of bit lines BLs, in response to the column address Y-ADDR. The bit lines BLs selected by column decoder 14 may be connected to the write/read circuit 15 via data lines DLs.

The write/read circuit 15 may write data DATA to the memory cell array 11, or read data DATA from the memory cell array 11. The write/read circuit 15 may write data DATA provided from the input/output buffer 16 to the memory cell array 11, or transfer the read data DATA to the input/output buffer 16. The write/read circuit 15 may include a write driver WD and a sense amplifier (SA).

The WD may write data DATA to memory cells which are selected by the row decoder 13 and the column decoder 14.

The SA may read the data DATA stored in the selected memory cells. The SA may include an amplifier which amplifies a signal of the bit line BL to which the selected memory cell is connected (or a signal of the data line DL to which the bit line BL is connected).

In the case of a differential sense amplifier, two input terminals of the SA may be connected to two bit lines BLs, and one bit line BL may provide the read data DATA, while the other bit lines BLs may be used to generate a reference voltage. However, in the case of a single-ended sense amplifier, one of the two input terminals of the SA may be connected to the bit line BL, while the other input terminal may receive the reference voltage which is generated from another component except the bit line BL.

According to aspects of example embodiments, the memory device 10 may use a single-ended sense amplifier. The SA may adaptively generate the reference voltage to the data DATA of the memory cell. The SA may generate the reference voltage which maintains voltage levels of a bit line voltage and the reference voltage higher than a certain level, based on a voltage that is practically equal to the bit line voltage, regardless of a value of the data DATA. For example, depending on the data DATA, the SA may generate the reference voltage at a relatively higher level, when the bit line voltage is low, and may generate the reference voltage at a relatively lower level, when the bit line voltage is high. Accordingly, compared to a case where the reference voltage at a constant level is provided regardless of the data DATA, a voltage difference between the reference voltage and the bit line voltage may increase, a sensing margin of the SA may improve, and both the SA and the memory device 10 may operate at low voltages. The SA will be described in more detail with reference to FIGS. 2 through 9 according to an example embodiment.

The input/output buffer 16 may receive the data DATA from the outside, for example, the memory controller and transfer the received data DATA to the write/read circuit 15. In addition, the input/output buffer 16 may output the read data DATA which is provided by the write/read circuit 15 to the outside.

Figure 2:
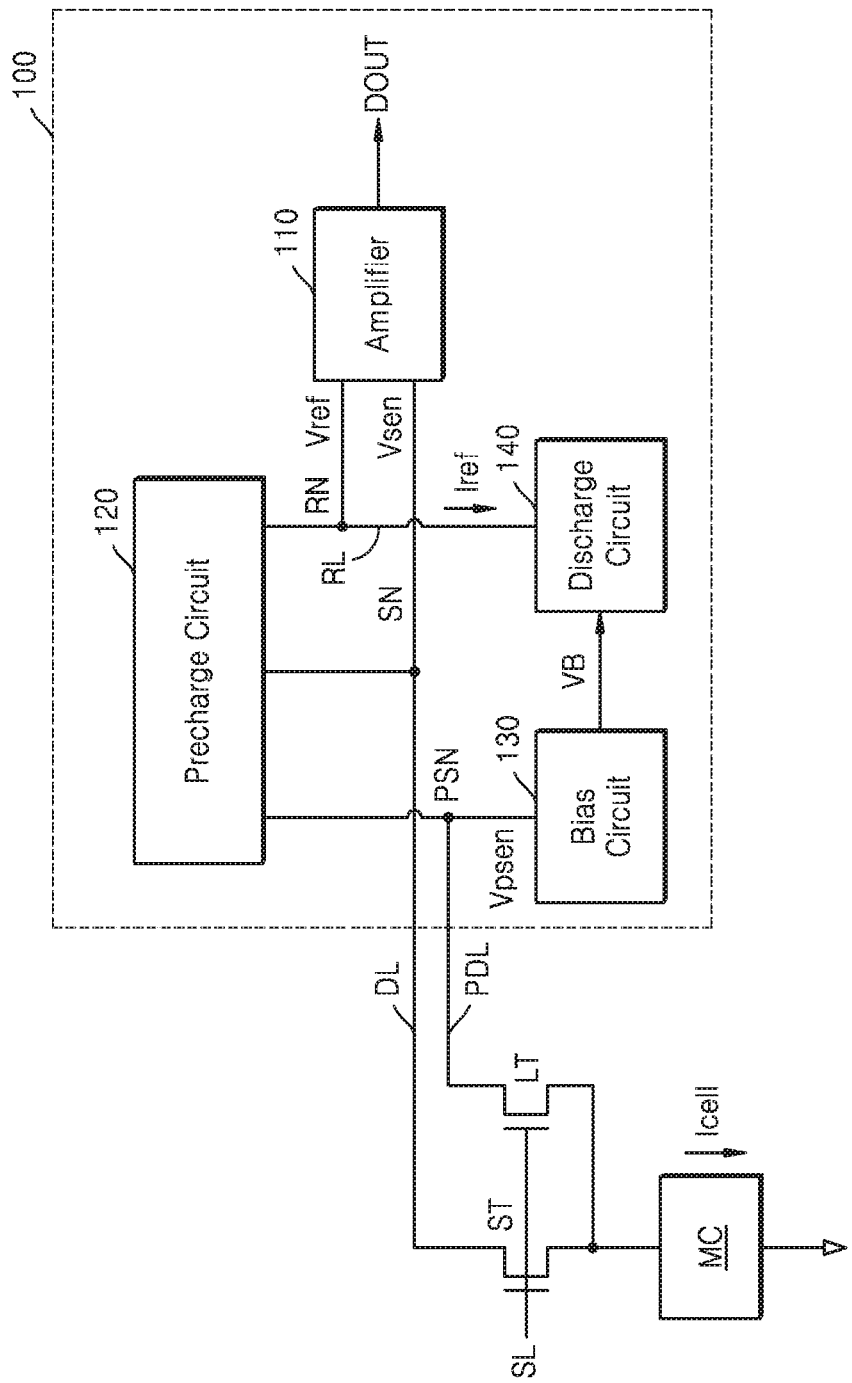
FIG. 2 is a block diagram of a sense amplifier according to an example embodiment.

FIG. 2 is a block diagram of a SA 100 according to aspects of example embodiments. For the sake of description convenience, memory cells and transistors which are connected to the SA 100 are illustrated altogether.

Referring to FIG. 2, the SA 100 may include an amplifier 110 having two input terminals, a precharge circuit 120, a bias circuit 130, and a discharge circuit 140. Both the bias circuit 130 and the discharge circuit 140 may be collectively referred to as reference voltage generating circuits.

The amplifier 110 may receive a sensing voltage Vsen and the reference voltage Vref, compare them, and amplify and output a voltage difference between them. The Vsen may be a voltage of the DL to be sensed, that is, a voltage of a sensing node SN, and the Vref may be a voltage of a reference line RL as a basis of comparison, that is, a voltage of a reference node RN. According to an example embodiment, the amplifier 110 may be implemented as a comparator.

The precharge circuit 120 may precharge the data line DL, the reference line RL, and a pseudo data line PDL with a power supply voltage. During a data read operation, the precharge circuit 120 may precharge the data line DL and the reference line RL, and thus, the power supply voltage may be applied to the data line DL and the reference line RL.

The discharge circuit 140 may be connected to the reference line RL and discharge a reference current Iref from the reference line RL. Accordingly, the reference voltage Vref may be lowered. For example, the reference voltage Vref may be lowered from a voltage level of the power supply voltage to the voltage level close to a ground voltage.

The bias circuit 130 may provide a bias voltage VB to the discharge circuit 140. The discharge circuit 140 may generate the Iref based on the VB. The bias circuit 130 may generate the bias voltage VB based on a pseudo sensing voltage Vpsen which is output via the pseudo data line PDL, that is, a voltage of a pseudo sensing node PSN. The pseudo sensing voltage Vpsen may be actually identical to the sensing voltage Vsen, and the sensing voltage Vsen may vary depending on data stored in the memory cell MC. Accordingly, the Iref and the subsequent Vref may adaptively vary according to the data stored in the memory cell MC.

After a selection voltage has been applied to the selection line SL, a selection transistor ST may be turned on, and the memory cell MC may be connected to the DL. Practically, the memory cell MC may be connected to the DL via the bit line BL. As a cell current Icell may be discharged via the memory cell MC, the Vsen may be lowered. In this case, the current amount of the cell current Icell which is discharged via the memory cell MC may vary depending on the data stored in the memory cell MC, for example, either 0 or 1. For example, when the data is 1, the cell current Icell may be greater than that when the data is 0. According to an example embodiment, when the data is 0, a very little amount or none of the cell current Icell may flow. Thus, a voltage down slope of the sensing voltage Vsen may vary depending on the data.

During the data read operation, after the precharge circuit 120 has precharged the data line DL and the reference line RL with the power supply voltage, the discharge circuit 140 and the memory cell MC may respectively discharge the reference node RN and the data line DL as described above, and the current amount of the cell current Icell and the reference current Iref may be different. In this case, a relative current amount of the cell current Icell and the reference current Iref may vary depending on the data stored in the memory cell MC. For example, when the data is 1, the cell current Icell may be greater than the reference current Iref, and when the data is 0, the cell current Icell may be less than the reference current Iref. Accordingly, when the data is 1, the sensing voltage Vsen may be lower than the reference voltage Vref, and when the data is 0, the sensing voltage Vsen may be higher than the reference voltage Vref.

The amplifier 110 may output a result of comparing the sensing voltage Vsen with the reference voltage Vref as a read data DOUT of the memory cell MC. When the data stored in the memory cell MC is 1, since the sensing voltage Vsen is lower than reference voltage Vref, the amplifier 110 may output the read data DOUT as 1. When the data stored in the memory cell MC is 0, since the sensing voltage Vsen is higher than the reference voltage Vref, the amplifier 110 may output the read data DOUT as 0.

As described above, the reference current Iref and the subsequent reference voltage Vref may adaptively vary according to the data stored in the memory cell MC. Since the voltage down slope of the sensing voltage Vsen varies according to the data, the bias circuit 130 may generate the bias voltage VB, which may change the current amount of the reference current Iref according to the data, so that the voltage difference between the sensing voltage Vsen and the reference voltage Vref is maintained at a level higher than a certain level or at the maximum level regardless of the data. For example, when the data is 1, the cell current Icell is strong, and when the sensing voltage Vsen decreases, the reference voltage Vref may be maintained at a high level by reducing the reference current Iref based on the sensing voltage Vsen. In addition, when the data is 0, the cell current Icell is weak, and when the sensing voltage Vsen is maintained at a high level, the reference voltage Vref may be lowered by increasing the reference current Iref. Accordingly, the sensing margin may be improved by increasing the voltage difference between the reference voltage Vref and the sensing voltage Vsen.

In this case, the bias circuit 130 may generate the bias voltage VB, based on a voltage of the pseudo data line PDL, that is, the sensing voltage Vpsen which is practically equal to a voltage of the data line DL, that is, the sensing voltage Vsen. A load transistor LT may be connected to the pseudo data line PDL, as illustrated, to make the voltage of the pseudo data line PDL practically equal to that of the data line DL. A source of the load transistor LT may be connected to the memory cell MC, and a gate of the load transistor LT may be connected to the selection line SL. According to an example embodiment, the size of the load transistor LT may be equal to that of the selection transistor ST. When the selection transistor ST is turned on, the load transistor LT is also turned on, and when the current amount flowing through the selection transistor ST is equal to that flowing through the load transistor LT, the voltage of the identical pseudo data line PDL may be equal to that of the data line DL.

Figure 3:
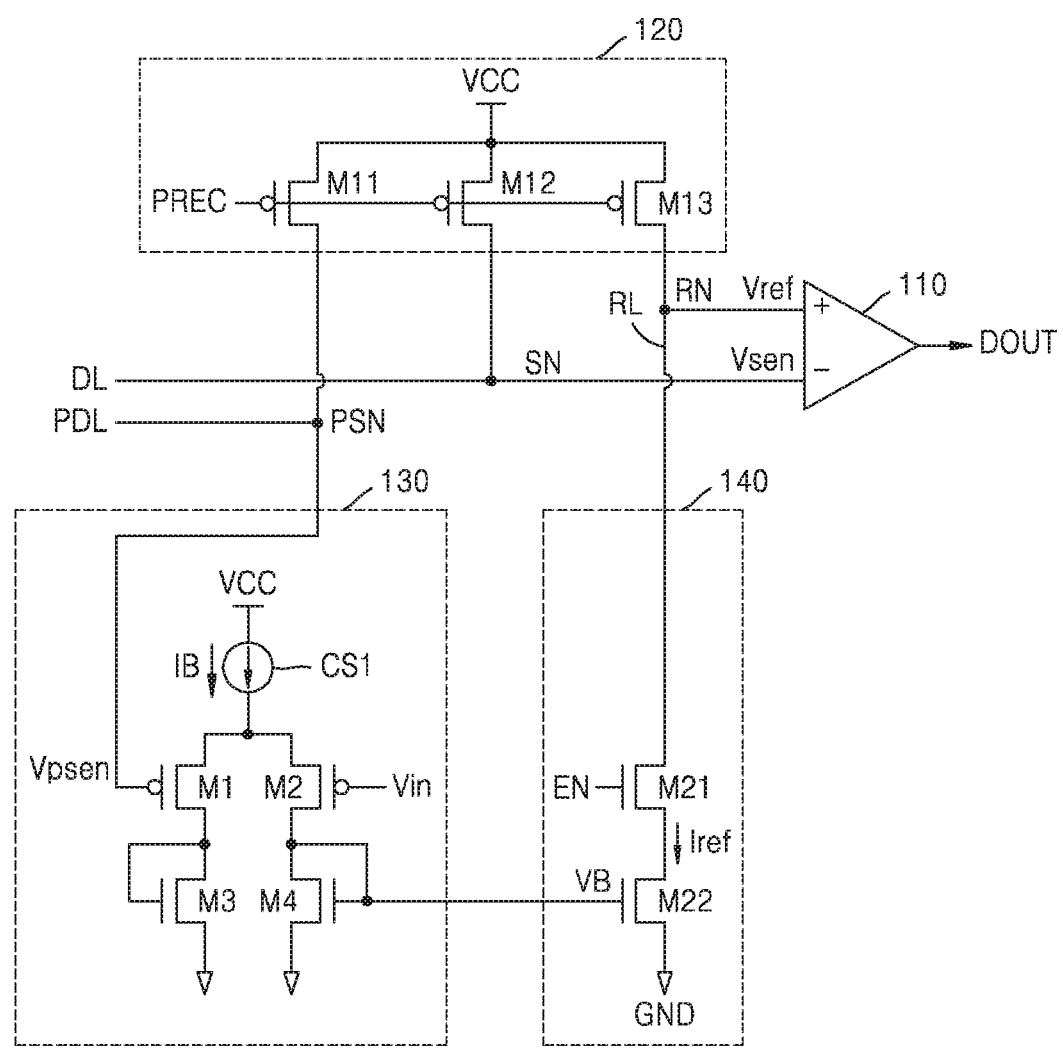
FIG. 3 is a detailed circuit diagram of the sense amplifier of FIG. 2.

FIG. 3 is a detailed circuit diagram of the sense amplifier SA100 of FIG. 2.

The amplifier 110 may be implemented as a comparator having two input terminals (+, and −), and the reference voltage Vref may be applied to one input terminal (+), while the sensing voltage Vsen may be applied to the other input terminal (−). The amplifier 110 may operate with the power supply voltage VCC and the ground voltage GND as bases. When the voltage level of the reference voltage Vref is higher than that of the sensing voltage Vsen, the amplifier 110 may output the power supply voltage VCC indicating that the data is 1. When the voltage level of the reference voltage Vref is lower than that of the sensing voltage Vsen, the amplifier 110 may output the ground voltage GND indicating that the data is 0.

The precharge circuit 120 may include a plurality of transistors M11, M12 and M13 to which a precharge signal PREC is applied to gate terminals of the plurality of transistors. The M11 may be connected to the pseudo data line PDL, the M12 to the data line DL, and the M13 to the reference line RL. The plurality of transistors M11, M12 and M13 are turned on when the precharge signal PREC is at a low level, and may precharge the pseudo data line PDL, the data line DL, and the reference line RL based on the power supply voltage VCC. Accordingly, voltage levels of the pseudo sensing voltage Vpsen, the sensing voltage Vsen, and the reference voltage Vref may be equal to the voltage level of the power supply voltage VCC.

The discharge circuit 140 may include a plurality of transistors M21 and M22 which are connected to the reference line RL in series. When the M21 is turned on in response to an enable signal EN at a high level, the reference current Iref may flow via the M22. In this case, the current amount of the reference current Iref may be determined by the bias voltage VB. For example, when the bias voltage VB increases, the current amount of the reference current Iref may increase, and when the bias voltage VB decreases, the current amount of the reference current Iref may decrease. As the reference current Iref flows, the reference voltage Vref may be lowered from precharged power supply voltage VCC. In this case, when the current amount of reference current Iref is strong, the reference voltage Vref may rapidly decrease, and when the current amount of the reference current Iref is weak, the reference voltage Vref may slowly decrease.

The bias circuit 130 may be implemented by a non-inverting differential amplifier, as illustrated. The bias circuit 130 may include a first current source CS1 and transistors M1, M2, M3 and M4.

The first current source CS1 may generate a bias current IB, that is, the bias current IB of the non-inverting differential amplifier. According to an example embodiment, the bias current IB may be equal to the cell current Icell which flows through the memory cell MC when the data of the memory cell MC in FIG. 2 is 1. According to an example embodiment, the first current source CS1 may be implemented by a current mirror circuit.

The transistors M1 and M2 may form a pair of differential inputs, and the transistors M3 and M4 may operate as loads. The transistor M4 may operate as a current mirror along with the transistor M22 in the discharge circuit 140. Thus, a current flowing through the transistor M22, that is, the reference current Iref, may be adjusted according to the current flowing through the transistor M4.

The pseudo sensing voltage Vpsen may be applied to the transistor M1, and an input voltage Vin, which has a constant level and allows the transistor M2 to operate in a saturated state, may be applied to the transistor M2. The input voltage Vin may be set up to a level as close as to that of the power supply voltage VCC while allowing the transistor M2 to operate at the saturated state. The input voltage Vin may be generated inside or outside the bias circuit 130.

The bias current IB may flow through the transistors M1, M2, M3 and M4. When the voltage level of the pseudo sensing voltage Vpsen is lower than a certain voltage level, for example, the input voltage Vin, the bias current IB may mainly flow through the transistors M1 and M3, and no or a little amount of current may flow through the transistors M2 and M4. Accordingly, the bias voltage VB may be lowered and the current amount of the reference current Iref may decrease.

When the level of the pseudo sensing voltage Vpsen is higher than that of the input voltage Vin, the bias current IB may mainly flow through the transistors M2 and M4, and no or a little amount of current may flow through the transistors M1 and M3. Accordingly, the bias voltage VB may increase and the amount of the reference current Iref may increase.

Figure 4:
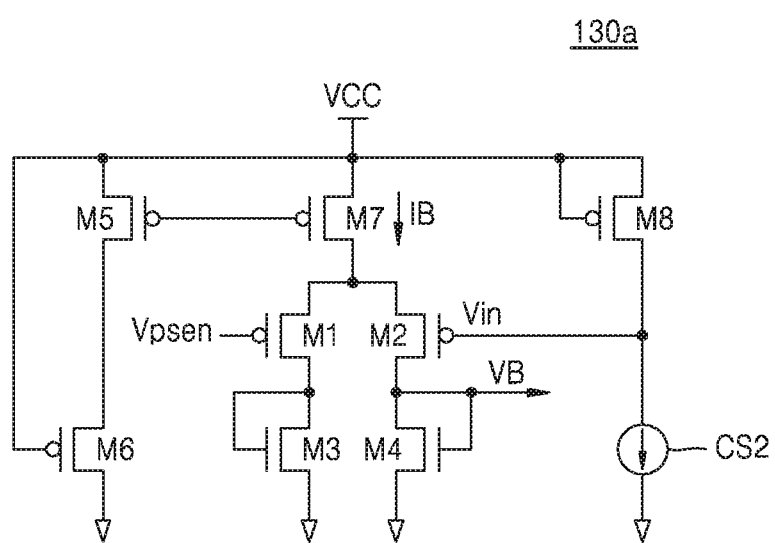
FIG. 4 is a circuit diagram illustrating a bias circuit according to an example embodiment.

FIG. 4 is a circuit diagram of a bias unit 130a according to an example embodiment. The bias unit 130a of FIG. 4 is a modified example of the bias circuit 130 in FIG. 3. Operations of the transistors M1, M2, M3 and M4 are identical to those of the transistors M1, M2, M3 and M4 of the bias circuit 130 in FIG. 3 and repeated descriptions thereof are omitted.

Referring to FIG. 4, the first current source CS1 of the bias circuit 130 in FIG. 3 may be implemented by a current mirror including the transistors M5, M6 and M7. A same amount current as the cell current Icell when the data of the memory cell MC is 1 may flow through the transistor M6. According to an example embodiment, the size of the transistor M6 may be equal to that of the memory cell MC in FIG. 2. The bias current IB may flow through the transistor M7, and the current amount of the bias current IB may be equal to that of a current flowing through the transistor M6 due to a current mirroring operation of the transistors M5 and M7.

The input voltage Vin may be generated inside the bias unit 130a. As a current generated by a second current source CS2 flows through a transistor M8, a voltage of a drain terminal of the transistor M8 may be applied to the transistor M2 as the input voltage Vin.

Figure 5:
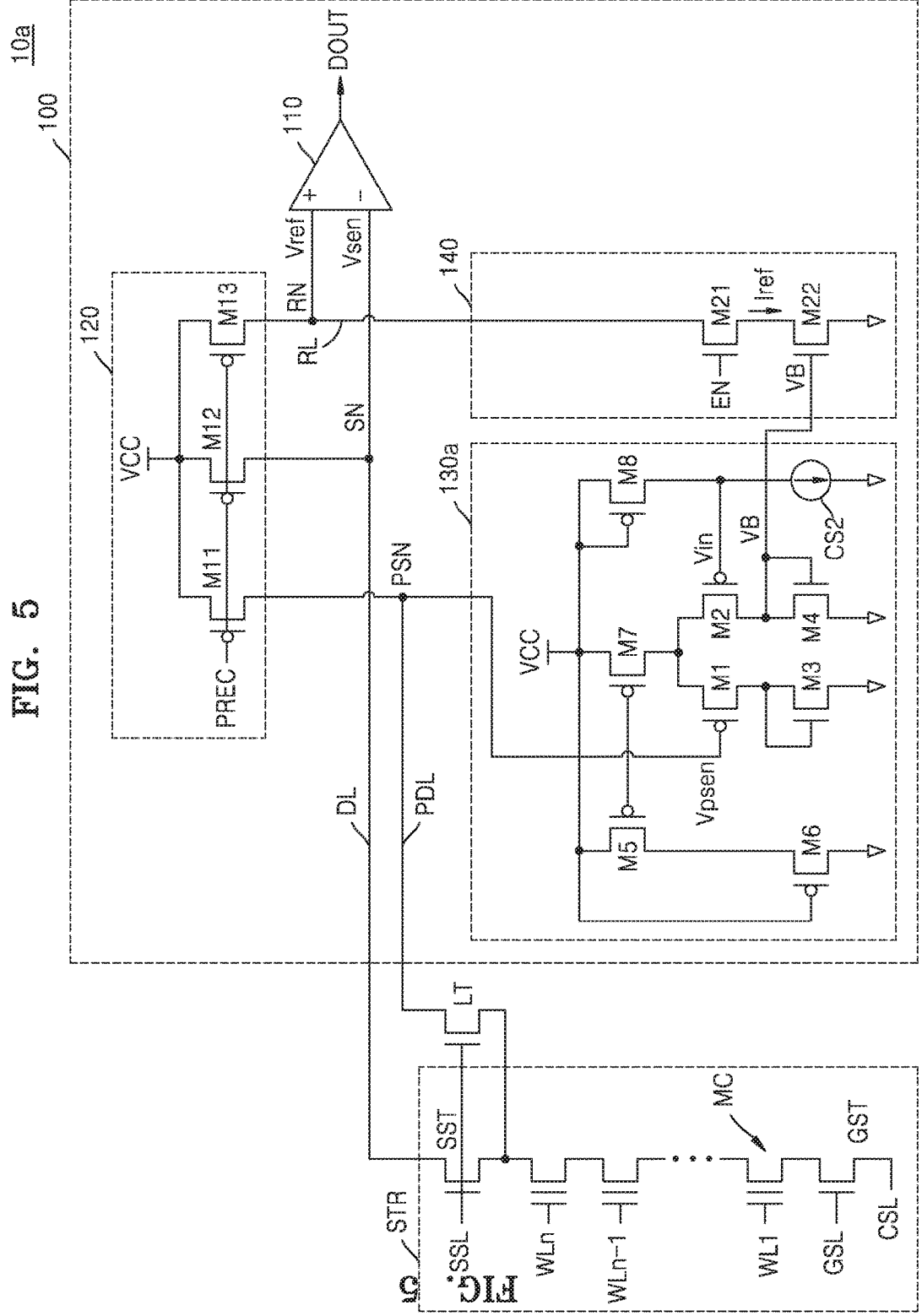
FIG. 5 is a circuit diagram of a memory device according to an example embodiment.

FIG. 5 is a circuit diagram of a memory device 10a according to an example embodiment.

Referring to FIG. 5, the memory device 10a may be a negative-AND (NAND) flash memory device. The memory device 10a may include a cell string STR, the load transistor LT, and the sense amplifier SA 100. The memory cell array 11 in FIG. 1 may include the cell string STR. Even though not illustrated, the memory device 10a may further include other components than the ones illustrated in FIG. 1. For the sake of description convenience, one cell string STR is illustrated; however, the embodiment is not limited thereto, and a plurality of cell strings STRs may be connected to the data line DL.

The cell string STR may include a plurality of memory cells MCs, a string selection transistor SST, and a ground selection transistor GST. As illustrated, the plurality of memory cells MCs, the string selection transistor SST, and the ground selection transistor GST may be connected to each other in series, and to a common source line CSL and the data line DL. According to an example embodiment, the ground voltage GND may be applied to the common source line CSL.

Word lines WL1~WLn may be connected to gates of the plurality of the memory cell MCs, and the string selection line SSL to a gate of the string selection transistor SST, and the ground selection lines GSL to a gate of the ground selection transistor GST.

For example, when data is to be read from the memory cell MC connected to the first word line WL1 of the cell string STR, a string selection voltage may be applied to the string selection line SSL. Accordingly, the illustrated cell string STR may be connected to the data line DL. The read voltage may be applied to the first word line WL1, while the read inhibit voltage (or a pass voltage) may be applied to the other word lines. A ground selection voltage may be applied to the ground selection lines GSL. All the other memory cells MCs except the memory cell MC connected to the first word line WL1, and the ground selection transistor GST may be turned on. When a threshold voltage of the memory cell MC connected to the first word line WL1 is lower than the read voltage, it may be determined that data 1 is stored in the memory cell MC. Alternatively, when the threshold voltage of the memory cell MC is higher than the read voltage, it may be determined that data 0 is stored in the memory cell MC. When the data of the memory cell MC is 1, the memory cell MC may be turned on as the read voltage is applied thereto, and the cell current Icell may be discharged from the data line DL. The voltage of the data line DL, that is, the sensing voltage Vsen, may rapidly fall from the level of the power supply voltage VCC. When the data of the memory cell MC is 0, the memory cell MC may not be turned on, and thus, the cell current Icell may not be discharged from the data line DL or, depending on the case, very little amount of the cell current Icell may be discharged. The voltage of the data line DL may maintain the level of the power supply voltage VCC or may very slowly fall.

One terminal of the load transistor LT connected to the pseudo data line PDL may be connected to the cell string STR. In detail, one terminal of the load transistor LT may be connected to a node to which the string selection transistor SST and the memory cell MC are connected. According to an example embodiment, the size of the load transistor LT may be equal to that of the string selection transistor SST. When the cell current Icell is discharged through the cell string STR, a current amount equal to that flowing through the string selection transistor SST may flow through the load transistor LT. Thus, the voltage of the pseudo data line PDL may be equal to that of the data line DL.

As described above, the sense amplifier SA 100 may compare the sensing voltage Vsen with the reference voltage Vref and output the comparison result as the read data DOUT. In this case, the sense amplifier SA 100 may adjust the current amount of the reference current Iref based on the voltage of the pseudo data line PDL, that is, the sensing voltage Vpsen. When the sensing voltage Vpsen is lower than the input voltage Vin, the amount of reference current Iref may be very little. Accordingly, the reference voltage Vref may be maintained at a level similar to that of the precharged power supply voltage VCC.

Alternatively, when the sensing voltage Vpsen is maintained at a level higher than that of the input voltage Vin, that is, the level of the power supply voltage VCC, the amount of reference current Iref may increase and the reference voltage Vref may rapidly fall.

Figure 6:
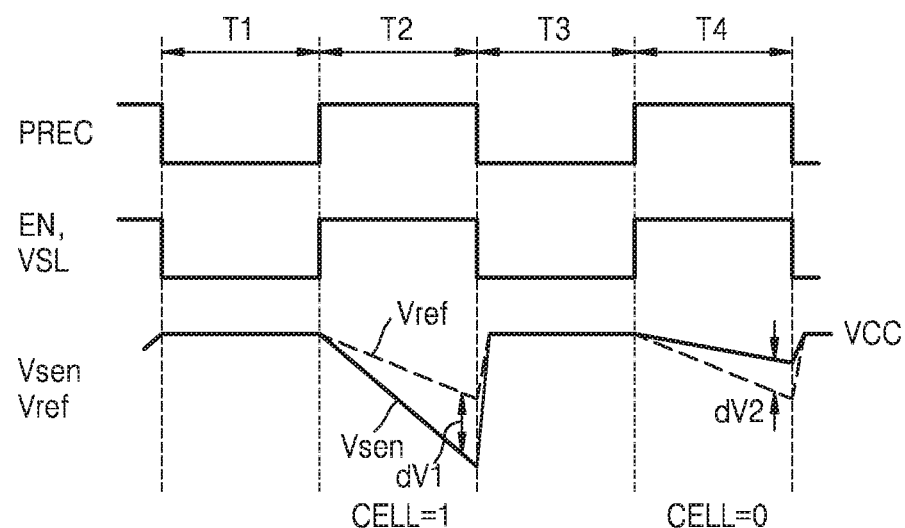
FIG. 6 is a timing diagram illustrating waveforms of a sense amplifier according to a conventional example.
Figure 7:
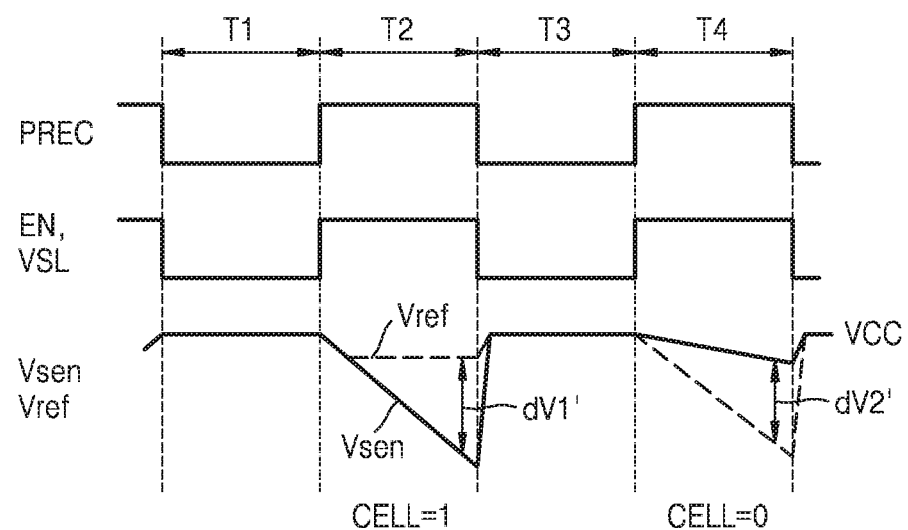
FIG. 7 is a timing diagram illustrating waveforms of a sense amplifier according to an example embodiment.

FIG. 6 is a timing diagram illustrating waveforms of a sense amplifier according to a conventional example, and FIG. 7 is a timing diagram illustrating waveforms of sense amplifier according to an example embodiment.

Referring to FIGS. 6 and 7, sections T1 and T3 are precharge sections, and sections T2 and T4 are data measurement sections. In sections T1 and T3, the precharge signal PREC at a low level may be applied, and the data line DL and the reference line RL may be precharged up to the power supply voltage VCC. Thus, levels of the sensing voltage Vsen and the reference voltage Vref may become equal to the level of the power supply voltage VCC.

In sections T2 and T4, the enable signal EN and a selection line signal VSL at high levels are applied. The memory cell MC may be connected to the data line DL, the cell current Icell may be discharged from the data line DL, and the reference current Iref may be discharged from the reference line RL. Accordingly, the reference voltage Vref and the sensing voltage Vsen may fall. When the data of the memory cell MC, that is, a cell data CELL is 1, the sensing voltage Vsen may rapidly fall and may be lower than the reference voltage Vref. When the cell data CELL is 0, the sensing voltage Vsen may slowly fall and may be higher than the reference voltage Vref.

Referring to FIG. 6, a same amount of the reference current Iref may be discharged from the reference line RL regardless of a value of the cell data CELL in the sense amplifier according to a comparative example. Accordingly, the voltage down slope of the reference voltage Vref may be the same whether the cell data CELL is 1 or 0.

However, according to an example embodiment, when the cell data CELL is 1, a little amount or none of the reference current Iref may flow in the sense amplifier, and thus, the reference voltage Vref may very slowly fall or the reference voltage Vref may be maintained at a level similar to that of the power supply voltage VCC. In addition, when the cell data CELL is 0, a large amount of the reference current Iref may flow and thus, the reference voltage Vref may rapidly fall. Accordingly, when the cell data CELL is 1, a voltage difference between the reference voltage Vref and the sensing voltage Vsen dV1' according to an example embodiment may be greater than a voltage difference dV1 in the sense amplifier according to a comparative example. When the cell data CELL is 0, a voltage difference between the Vref and the Vsen dV2' according to an example embodiment may be greater than a voltage difference dV2 in the sense amplifier according to a comparative example. In addition, the voltage difference between the Vref and the Vsen dV1' may be similar to the voltage difference dV2' when the cell data CELL is 0. Accordingly, the sense amplifier according to an example embodiment may have an improved sensing margin, and as the sensing margin is improved, the sense amplifier and the memory device including the sense amplifier may operate at low voltages.

Figure 8:
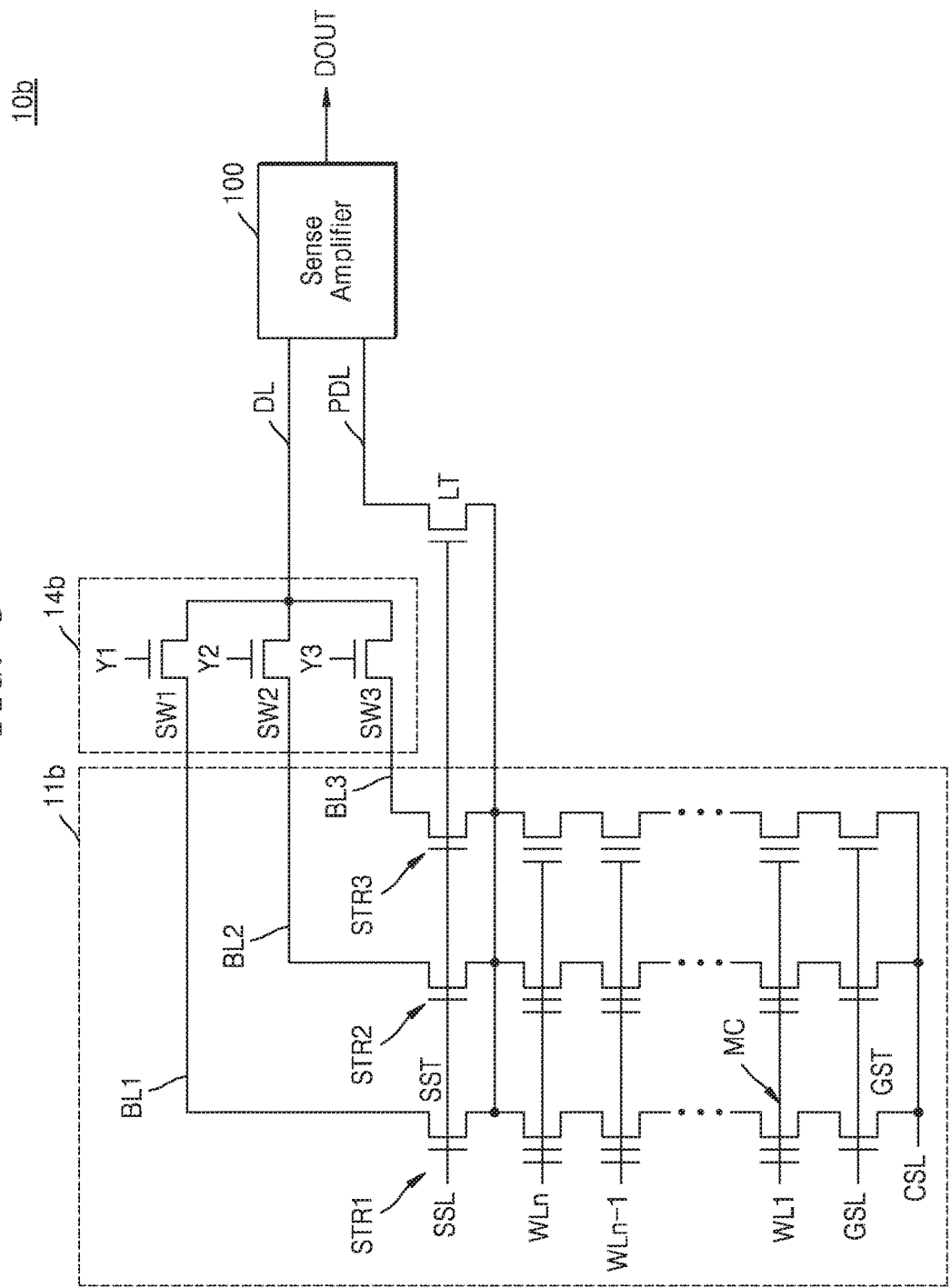
FIG. 8 is a circuit diagram of a memory device according to an example embodiment.

FIG. 8 is a circuit diagram of a memory device 10*b* according to an example embodiment.

The memory device 10*b* illustrated in FIG. 8 is a NAND flash memory device. Referring to FIG. 8, the memory device 10*b* may include a memory cell array 11*b*, a column decoder 14*b*, the sense amplifier SA 100, and the load transistor LT. Even though it is not illustrated, the memory device 10*b* may further include other components than the ones illustrated in the memory device 10 of FIG. 1.

According to an example embodiment, a plurality of cell strings STR1, STR2 and STR3 may be connected to the data line DL. For the sake of description convenience, three cell strings are illustrated in FIG. 8. The first cell string STR1 may be connected to a first bit line BL1, the second cell string STR2 to a second bit line BL2, and the third cell string STR3 to a third bit line BL3. The first through third bit lines BL1, BL2 and BL3 may be respectively connected to a first through third switches SW1, SW2 and SW3 of the column decoder 14*b*, and may be connected to the data line DL when respective, corresponding switches is turned on. The column decoder 14*b* may apply a first through third switching signals Y1, Y2 and Y3 according to column addresses to the first through third switches SW1, SW2 and SW3. Accordingly, one switch among the first through third switches SW1, SW2 and SW3 may be selectively turned on.

For example, when the first switch SW1 is turned on and the first cell string STR1 is connected to the data line DL, the first bit line BL1 may be precharged up to the power supply voltage VCC, and when the string selection transistor SST is turned on, the reference current Iref may flow through the first cell string STR1, in response to the data of the memory cell MC from which the data is to be read. Accordingly, the voltage of the data line DL may be lowered. In addition, since identical current flows through the load transistor LT, the voltage of the pseudo data line PDL may be lowered and the voltage level of the pseudo data line PDL may become equal to that of the data line DL.

Figure 9:
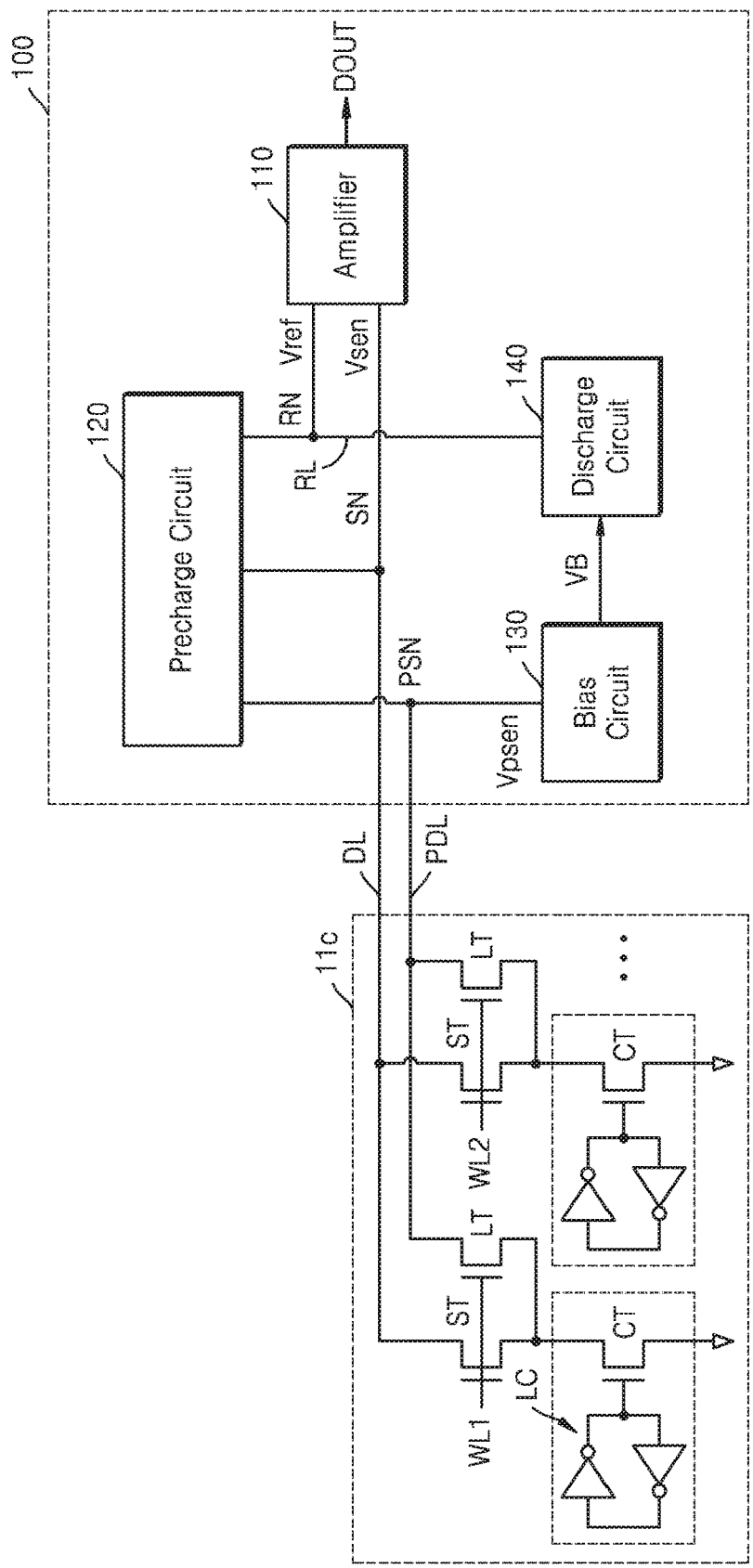
FIG. 9 is a circuit diagram of a memory device according to an example embodiment.

FIG. 9 is a circuit diagram of a memory device 10*c* according to an example embodiment.

The memory device 10*c* of FIG. 9 may be the SRAM. The memory device 10*c* may include a memory cell array 11*c*, the sense amplifier SA 100, and the load transistor LT. Even though not illustrated, the memory device 10c may further include other components than the ones illustrated in the memory device 10 of FIG. 1.

A plurality of memory cells MC1 and MC2 may be selectively connected to the data line DL. For the sake of description convenience, two memory cells are illustrated in FIG. 9. The plurality of memory cells MC1 and MC2 may be connected to the data line DL when respective, corresponding selection transistors STs are turned on. Word lines WL1 and WL2 may be connected to gate terminals of the selection transistors STs, and when the word line voltage, for example, the selection voltage is applied to the word lines WL1 and WL2, the selection transistors STs may be turned on. One selection transistor ST may be selectively turned on. The load transistor LT may be connected to between the pseudo data line PDL and the memory cells MC1 and MC2. The plurality of load transistors LTs are illustrated as being connected to each of the plurality of memory cells MC1 and MC2 in FIG. 9; however, the embodiment is not limited thereto, and one load transistor LT may be connected to the plurality of memory cells MC1 and MC2. The size of the load transistor LT may be equal to that of the selection transistor ST.

The memory cells MC1 and MC2 may include a latch LC and a cell transistor CT. When the memory cell MC is connected to the data line DL and data stored in the latch LC, that is, the cell data CELL is 1, the cell transistor CT may be turned on and a lot of the cell current Icell may flow through the cell transistor CT. Thus, the voltage of the data line DL may rapidly fall. When the data stored in the latch LC, that is, the cell data CELL is 0, the cell transistor CT may be turned off and none or very little amount of the cell current Icell may flow through the cell transistor CT. Accordingly, the voltage of the data line DL may maintain the power supply voltage VCC or may very slowly fall. The voltage level of the pseudo data line PDL may be equal to that of the data line DL.

Hereinabove, examples are described in which the sense amplifier and the memory device are applied to the NAND flash memory device or the SRAM memory device according to an example embodiment. However, the embodiment is not limited thereto, and the sense amplifier and the memory device according to an example embodiment may be applicable to various memory devices using the single-ended sense amplifier.

Figure 10:
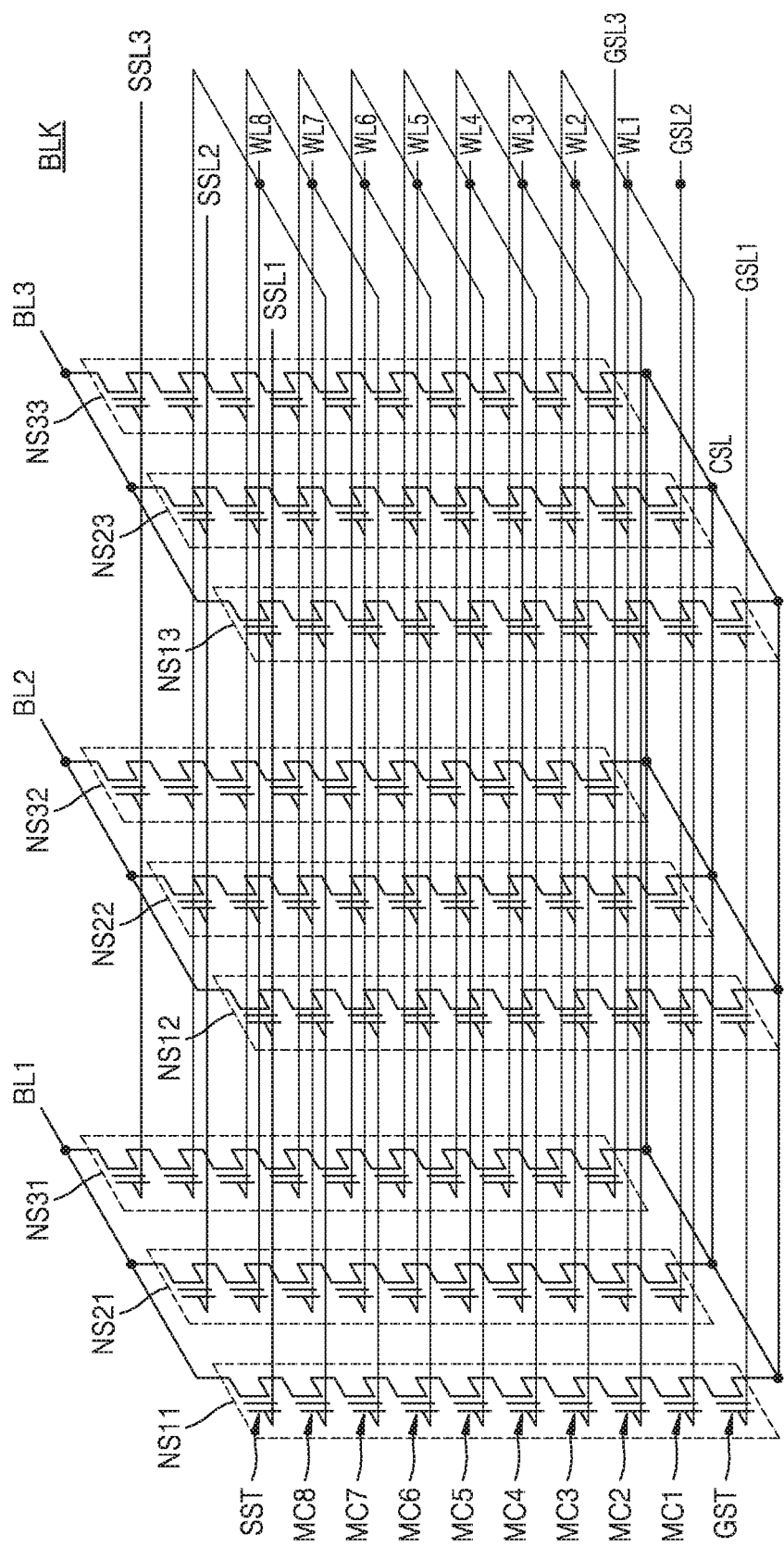
FIG. 10 is a circuit diagram illustrating a implemented example of a memory block according to an example embodiment.

FIG. 10 is a circuit diagram illustrating an implemented example of a memory block BLK according to an example embodiment.

Referring to FIG. 10, the memory block BLK may be a vertically structured NAND flash memory. The memory block BLK may include a plurality of NAND strings NS11 through NS33, the plurality of word lines WL1 through WL8, the plurality of bit lines BL1 through BL3, ground selection lines GSL1 through GSL3, a plurality of string selection lines SSL1 through SSL3, and the common source line CSL. The number of NAND strings, word lines, bit lines, ground selection lines, and string selection lines may variously be changed according to an example embodiment.

The NAND strings NS11, NS21 and NS31 may be provided between the first bit line BL1 and the common source line CSL, the NAND strings NS12, NS22 and NS32 between the second bit line BL2 and the common source line CSL, and the NAND strings NS13, NS23 and NS33 between the third bit line BL3 and the common source line CSL. Each of NAND strings (for example, NS11) may include the string selection transistor SST, the plurality of memory cells MC1 through MC8, and the ground selection transistor GST, which are connected to each other in series. Hereinafter, the NAND string is named as a string for the sake of convenience.

Strings commonly connected to one bit line may form one column. For example, strings NS11, NS21 and NS31 commonly connected to the first bit line BL1 may correspond to a first column, strings NS12, NS22 and NS32 commonly connected to the second bit line BL2 may correspond to a second column, and strings NS13, NS23 and NS33 commonly connected to the third bit line BL3 may correspond to a third column.

Strings commonly connected to one string selection line SSL may form one row. For example, strings NS11, NS12 and NS13 connected to the first string selection line SSL1 may correspond to a first row, strings NS21, NS22 and NS23 connected to the second string selection line SSL2 may correspond to a second row, and strings NS31, NS32 and NS33 connected to the third string selection line SSL3 may correspond to a third row.

The string selection transistor SST may be connected to the string selection lines SSL1 through SSL3. The plurality of memory cells MC1 through MC8 may be respectively connected to corresponding word lines WL1 through WL8. The ground selection transistor GST may be connected to ground selection lines GSL1, GSL2 and GSL3. The string selection transistor SST may be connected to the corresponding bit line BL, and the ground selection transistor GST may be connected to the common source line CSL.

The word lines at a same height (for example, WL1) may be commonly connected to each other, and the string selection lines SSL1, SSL2 and SSL3 are separate from each other. For example, when memory cells, which are connected to the first word line WL1 and included in strings NS11, NS12 and NS13, are programmed, the first word line WL1 and the first string selection line SSL1 may be selected. According to an example embodiment, ground selection lines GSL1, GSL2 and GSL3 may be separate from each other as illustrated in FIG. 10. In another embodiment, ground selection lines GSL1, GSL2 and GSL3 may be connected to each other.

Figure 11:
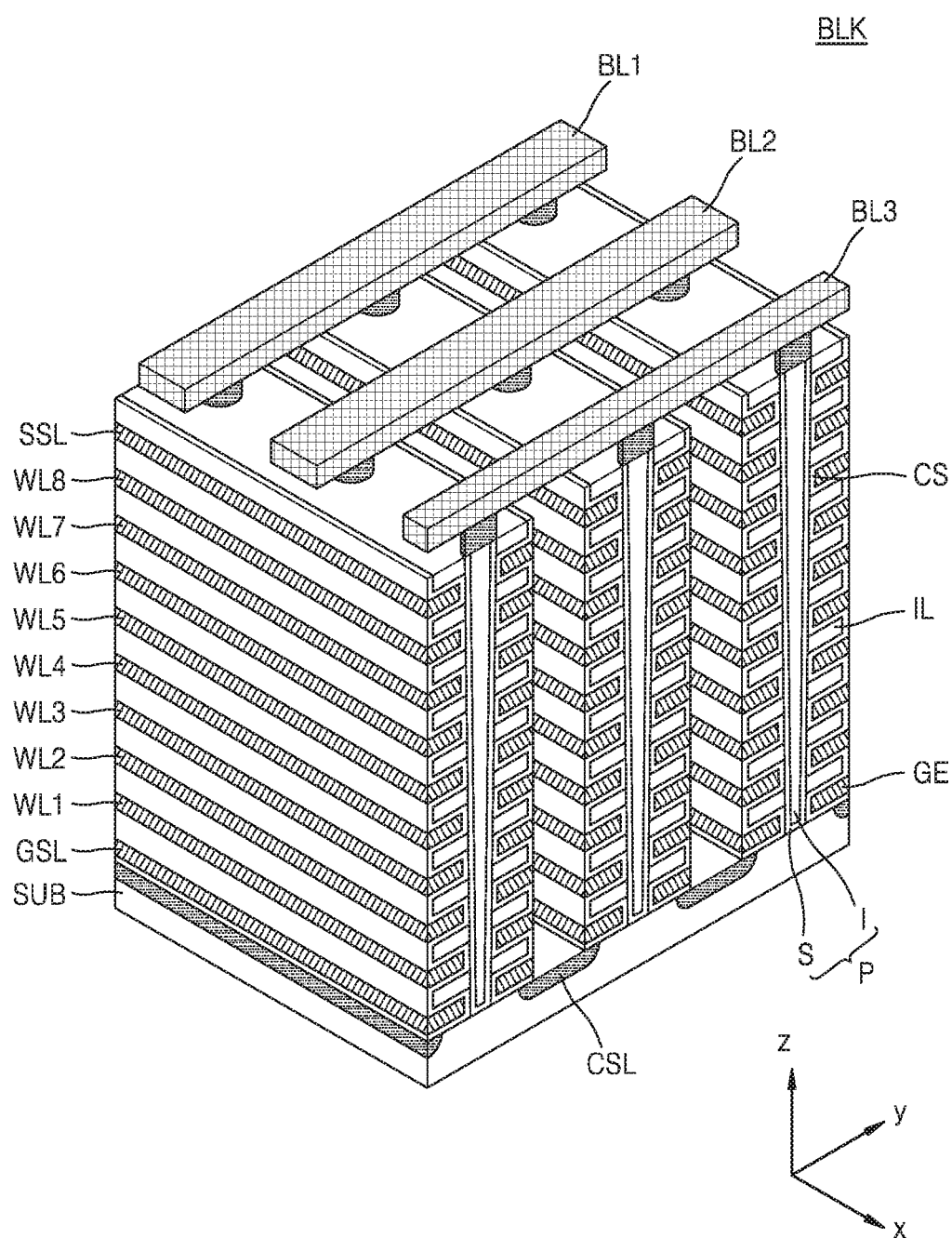
FIG. 11 is a perspective view of the memory block according to the circuit diagram of FIG. 10.

FIG. 11 is a perspective view of the memory block BLK according to the circuit diagram of FIG. 10.

Referring to FIG. 11, the BLK is formed in a vertical direction with respect to a substrate SUB. The substrate SUB may include a first conductivity type (for example, a p-type), and the common source line CSL which is extended along a first direction (for example, an x-direction) thereon and a second conductivity type (for example, n-type) is doped thereon may be provided. The common source line CSL may function as a source to supply current to vertical memory cells.

A plurality of insulating layers IL which are extended along a second direction (for example, a y-direction) may be sequentially provided on a region of the substrate SUB between two adjacent common source lines CSLs in a third direction (for example, a z-direction), and the plurality of insulating layers ILs may be separate from each other by a certain distance along the third direction. For example, the plurality of insulating layers ILs may include insulating material such as silicon oxide.

Channel holes may be formed which are sequentially arranged along the first direction on the region of the substrate SUB between two adjacent common source lines CSLs, and penetrate the plurality of insulating layers ILs along the third direction. The channel hole may be formed in a shape of a cup (or a cylinder with a closed bottom) and extended in a vertical direction. Alternatively, the channel hole may be formed in a shape of a pillar as illustrated. Hereinafter, the channel hole will be named as a pillar. The plurality of pillars Ps may penetrate through the plurality of insulating layers ILs and contact the substrate SUB. In detail, a surface layer S of each pillar P may include silicon material of the first type, and may function as a channel region. An inner layer I of each pillar P may include insulating material such as silicon oxide or an air gap.

A charge storage layer CS may be provided along exposed surfaces of the insulating layers ILs, the pillars Ps, and the substrate SUB, in a region between two adjacent common source lines CSLs. For example, the charge storage layer CS may have an oxide-nitride-oxide (ONO) structure. In addition, a gate electrode GE may be provided on an exposed surface of the charge storage layer CS, in a region between two adjacent common source lines CSLs.

Drains or drain contacts DRs may be respectively provided on the plurality of the pillars Ps. For example, the drains DRs may include silicon material with impurities of the second conductivity type doped thereon. The bit lines BLs which are extended along the second direction (for example, the y-axis) and separate from each other by a certain distance along the first direction may be provided on the drains DRs.

An example embodiment of the memory block BLK is described with reference to FIG. 11. However, the embodiment is not limited thereto, and a structure of the BLK may variously change.

Figure 12:
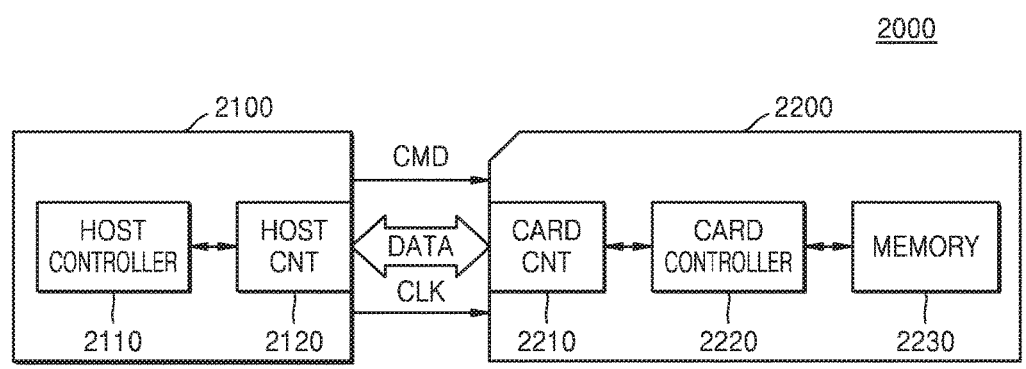
FIG. 12 is a block diagram of a memory card system according to an example embodiment.

FIG. 12 is a block diagram of a memory card system 2000 according to an example embodiment.

Referring to FIG. 12, the memory card system 2000 may include a host 2100 and a memory card 2200. The host 2100 may include a host controller 2110 and a host connector 2120. The memory card 2200 may include a card connector 2210, a card controller 2220, and a memory device 2230.

The host 2100 may write data to the memory card 2200 or read data stored in the memory card 2200. The host controller 2110 may transfer the command CMD, a clock signal CLK, and data DATA to the memory card 2200 via the host connector 2120.

The card controller 2220 may store the data DATA to the memory device 2230, in response to the command CMD received via the card connector 2210. The memory device 2230 may store the data DATA transferred from the host 2100. The memory device 2230 may include the memory device 10 of FIG. 1 which is described above with reference to FIG. 1. The memory device 2230 may operate at a low voltage due to the improved sensing margin of the sense amplifier which is internally provided.

The memory card 2200 may be implemented by a compact flash card (CFC), a microdrive, a smart media card (SMC), a multimedia card (MMC), a secure digital card (SDC), a memory stick, a USB flash memory driver, etc.

The sense amplifier and the memory device according to embodiments may be applicable to various memory devices and systems. The memory device according to embodiments may be applicable to a computer system, a solid state drive (SSD) system, a universal flash storage (UFS) system, etc.

According to an example embodiment, the memory card, the non-volatile memory device, and the card controller may be arranged by using various types of packages. For example, the memory device and/or the memory controller according to an example embodiment may be arranged by using packages such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a system in package (SIP), a multi-chip package (MCP), a wafer-level fabricated package (WFP), and a wafer-level processed stack package (WSP).

While the inventive concept has been particularly shown and described with reference to embodiments thereof, it will be understood that various changes in form and details may be made therein without departing from the spirit and scope of the following claims.

What is claimed is:

1. A sense amplifier configured to sense and amplify data of a memory cell, the sense amplifier comprising:
    a precharge circuit,
        said precharge circuit configured to pre-charge a data line with a power supply voltage,
        said precharge circuit configured to pre-charge a reference line with the power supply voltage,
        said precharge circuit connected to the data line,
        said precharge circuit connected to the reference line,
        said data line connected to the memory cell and configured to provide a sensing voltage,
        said reference line configured to provide a reference voltage;
    a reference voltage generating circuit configured to generate the reference voltage by discharging the reference line based on a reference current, said reference voltage generating circuit configured to adjust an amount of the reference current based on the data of the memory cell; and
    a comparator configured to compare the sensing voltage with the reference voltage and is configured to output a comparison result as the data of the memory cell.

2. The sense amplifier of claim 1, wherein when the sensing voltage is lowered below a critical level, the reference current is decreased, and when the sensing voltage is higher than the critical level, the reference current is increased.

3. The sense amplifier of claim 1, wherein when the data of the memory cell has a first value, a current amount discharged from the data line is substantially equal to the amount of the reference current when the data of the memory cell has a second value.

4. The sense amplifier of claim 1, wherein when data of the memory cell has a first value, a voltage down slope of the sensing voltage is substantially equal to the voltage down slope of the reference voltage when the data of the memory cell has a second value.

5. The sense amplifier of claim 1, wherein the reference voltage generating circuit further comprises:
    a discharge circuit configured to generate the reference current and discharge the reference current from the reference line; and
    a bias circuit configured to generate a bias voltage that adjusts the amount of the reference current, based on a pseudo sensing voltage output from a pseudo data line, said pseudo data line substantially having an equal voltage level as the data line.

6. The sense amplifier of claim 5, wherein the current amount discharged from the pseudo data line is substantially equal to the current amount discharged from the data line.

7. The sense amplifier of claim 5, wherein the bias circuit comprises the pseudo sensing voltage and a non-inverting differential amplifier configured to receive an input voltage at a constant level.

8. The sense amplifier of claim 7, wherein the bias circuit is configured to generate the bias voltage to increase the reference current when the pseudo sensing voltage is lower than the input voltage, and is configured to generate the bias voltage to decrease the reference current when the pseudo sensing voltage is higher than the input voltage.

9. The sense amplifier of claim 7, wherein when the data of the memory cell has a first value, an amount of a bias current flowing through the non-inverting differential amplifier is substantially equal to the current amount discharged from the data line.

10. The sense amplifier of claim 7, wherein the non-inverting differential amplifier includes:
a first transistor receiving the pseudo sensing voltage, and a second transistor receiving the input voltage,
wherein the reference current is proportional to the current amount flowing through the second transistor.

11. A memory device comprising:
a memory cell array selectively connected to a data line and comprising a plurality of memory cells, wherein each cell is configured to discharge a cell current from the data line according to a stored data during a read operation;
a load transistor which is connected to a pseudo data line and is configured to discharge an equal amount of current as that of the cell current from the pseudo data line; and
a sense amplifier configured to generate a reference voltage based on a pseudo sensing voltage output from the pseudo data line, and is configured to compare a sensing voltage output from the data line with the reference voltage, and is configured to output a comparison result as the stored data.

12. The memory device of claim 11, wherein the sense amplifier includes:
a precharge circuit configured to precharge the data line providing the sensing voltage, a reference line providing the reference voltage, and the pseudo data line with a power supply voltage;
a reference voltage generating circuit configured to generate the reference voltage by discharging the reference line based on a reference current and adjust an amount of the reference current based on the pseudo sensing voltage; and
a comparator configured to compare the sensing voltage with the reference voltage and output a comparison result.

13. The memory device of claim 11, wherein one terminal of the load transistor is connected to the plurality of memory cells.

14. The memory device of claim 11, wherein the memory cell array comprises a three-dimensional memory cell array.

15. The memory device of claim 14, where the three-dimensional memory cell array comprises a plurality of memory strings that are perpendicular to a substrate.

16. A sense amplifier comprising:
a bias circuit configured to generate a bias voltage based on a pseudo data line, said pseudo data line is coupled to a memory cell in response to a control signal;
a discharge circuit configured to generate a reference current based on the bias voltage;
a reference line connected to the discharge circuit, said reference line configured to provide a reference voltage based on the reference current; and
a comparator configured to generate an output voltage based on the reference voltage and a sensing voltage, said comparator connected to the reference line and to a data line, said data line is coupled to the memory cell in response to the control signal and said data line different than said pseudo data line.

17. The sense amplifier of claim 16, wherein the bias circuit includes
a current source with a first node and a second node, said first node connected to a power supply voltage,
a first PMOS transistor including a first PMOS source and a first PMOS drain, said first PMOS source connected to the second node of the current source,
a second PMOS transistor including a second PMOS source and a second PMOS drain, said second PMOS source connected to the current source,
a first NMOS transistor, including a first NMOS gate, and a first NMOS drain, and a first NMOS source, said first NMOS gate connected to the first PMOS drain, said first NMOS drain connected to said first NMOS gate, said first NMOS source connected to a ground,
a second NMOS transistor, including a second NMOS gate, and a second NMOS drain, and a second NMOS source, said second NMOS gate connected to the second PMOS drain, said second NMOS drain connected to said second NMOS gate, said second NMOS source connected to the ground.

18. The sense amplifier of claim 16, wherein the bias circuit includes
a current source with a first node and a second node, the second node connected to a ground,
a first NMOS transistor including a first NMOS gate, and a first NMOS source, and a first NMOS drain, said first NMOS source connected to the ground, said first NMOS gate connected to the first NMOS drain,
a second NMOS transistor including a second NMOS gate, and a second NMOS source, and a second NMOS drain, said second NMOS source connected to the ground, said second NMOS gate connected to the second NMOS gate,
a first PMOS transistor including a first PMOS gate, a first PMOS source, and a first PMOS drain, said first PMOS drain connected to the first NMOS drain,
a second PMOS transistor including a second PMOS gate, a second PMOS source, and a second PMOS drain, said second PMOS drain connected to the second NMOS drain,
a third PMOS transistor including a third PMOS gate, a third PMOS source, and a third PMOS drain, said third PMOS source connected to a power supply,
a fourth PMOS transistor including a fourth PMOS gate, a fourth PMOS source, and a fourth PMOS drain, said fourth PMOS gate connected to the power supply, said fourth PMOS source connected to the third PMOS drain, said fourth PMOS drain connected to the ground,
a fifth PMOS transistor including a fifth PMOS gate, a fifth PMOS source, and a fifth PMOS drain, said fifth PMOS source connected to the power supply, said fifth PMOS gate connected to the third PMOS gate, said fifth PMOS drain connected to the first PMOS source, and said fifth PMOS drain connected to the second PMOS source, and a sixth PMOS transistor including a sixth PMOS gate, a sixth PMOS source, and a sixth PMOS drain, said sixth PMOS gate connected to the power supply, said sixth PMOS source connected to the power supply, said sixth PMOS drain connected to the first node of the current source, said sixth PMOS drain connected to the second PMOS gate.

19. The sense amplifier of claim 16, wherein the discharge circuit includes a first NMOS transistor including a first NMOS gate, a first NMOS source, and a first NMOS drain, said first NMOS drain connected to the reference line, and a second NMOS transistor including a second NMOS gate, a second NMOS source, and a second NMOS drain, said second NMOS drain connected to the first NMOS source, said second NMOS source connected to a ground.

20. The sense amplifier of claim 16, wherein the bias circuit is connected to a memory cell, and the memory cell is a vertical NAND memory cell.

* * * * *